United States Patent
Jozaki

(10) Patent No.: US 6,235,655 B1
(45) Date of Patent: May 22, 2001

(54) SEMICONDUCTOR MANUFACTURING SYSTEM AND SEMICONDUCTOR MANUFACTURING METHOD

(75) Inventor: Tomohide Jozaki, Kagoshima (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 09/448,590

(22) Filed: Nov. 24, 1999

(30) Foreign Application Priority Data

Nov. 26, 1998 (JP) .................................................. 10-335195

(51) Int. Cl.[7] .................................................. H01L 21/26
(52) U.S. Cl. .................................................. 438/795
(58) Field of Search .................................. 427/570, 560; 118/723; 216/68; 156/345; 438/795

(56) References Cited

U.S. PATENT DOCUMENTS

| | | | |
|---|---|---|---|
| 5,155,336 | * 10/1992 | Gronet et al. | 219/411 |
| 5,350,480 | * 9/1994 | Gray | 156/345 |
| 5,446,824 | * 8/1995 | Moslehi | 392/416 |
| 5,470,661 | * 11/1995 | Bailey et al. | 428/408 |
| 5,667,631 | * 9/1997 | Holland et al. | 216/13 |
| 5,770,099 | * 6/1998 | Rice et al. | 216/68 |
| 5,800,618 | * 9/1998 | Niori et al. | 118/723 |
| 6,074,512 | * 6/2000 | Collins et al. | 156/345 |

* cited by examiner

*Primary Examiner*—Matthew Smith
*Assistant Examiner*—Renzo Rocchegiani
(74) *Attorney, Agent, or Firm*—Sonnenschein, Nath & Rpsemtja

(57) ABSTRACT

A problem in the manufacture of semiconductor wafers exists in that reaction product adhering to a quartz member is peeled off and falls on wafers, thus causing particles to contaminate the wafers. In system of introducing electro-magnetic waves from the outside via the quartz member, an inventive high-density plasma etching system for processing wafers by introducing electro-magnetic waves generated by a TCP electrode into a vacuum chamber via a quartz top board and by generating plasma by exciting gas within the chamber comprises a far infrared ray heater disposed above the quartz top board to heat the quartz top board by radiant heat of infrared rays generated from the far infrared ray heater, reducing the product adhering to the quartz member and thus the contaminating particles, thereby improving the yield of the wafers.

5 Claims, 2 Drawing Sheets

SEMICONDUCTOR MANUFACTURING SYSTEM AND SEMICONDUCTOR MANUFACTURING METHOD

BACKGROUND OF THE INVENTION

1. Field of the Invention:

The present invention relates to a semiconductor manufacturing system such as an etching system, a CVD (chemical vapor deposition) system and a sputtering system widely used in forming thin films in micro-processing systems for processing devices typified by semiconductors and electronic device parts and to a semiconductor manufacturing method using the same. More specifically, the invention relates to a plasma processing system for processing workpieces such as a wafer by introducing electromagnetic waves into a vacuum chamber via a quartz member and by generating plasma by exciting gas within the chamber and to a semiconductor manufacturing method using the same.

2. Description of the Related Art:

Presently, etching is widely used as a method for forming a micro-processing pattern in micro-processing systems for processing devices typified by semiconductors and electronic devices parts. An etching system which is a micro-processing system for implementing this processing is required to have a high aspect ratio, a high selectively and a high etching rate and also to suppress particles which might otherwise cause disconnection and short circuits. For instance, when particles exist between wires in etching an aluminum wiring pattern, they cause short circuits and lower the yield of products remarkably.

However, the above-mentioned requirements cannot all be optimized simultaneously, since they interact Recent Advancements in the density and integration of devices have utilized a chamber provided with a plasma source for generating high density plasma in a high vacuum condition, but the particles caused by an ion bombard in parts within this chamber which are exposed to the high density plasma have become a serious problem.

Specifically, while many of the latest high density plasma systems adopt a method of introducing electro-magnetic waves into the chamber from the outside via quartz parts, reaction product adhering to the quartz parts poses a serious problem because it peels off and falls on wafers. When a large number of wafers are processed in the chamber in which high-density plasma is generated, the reaction product adheres to and deposits on the quartz top board disposed right above the chamber. When the deposit of the product becomes large enough, it falls on the wafers, creating contaminating particles.

SUMMARY OF THE INVENTION

The present invention has been devised in view of the problems described above and an object thereof is to provide a semiconductor manufacturing system, and a semiconductor manufacturing method, which is capable of reducing particles which are otherwise produced due to telling reaction product adhering to a quartz member.

The inventive semiconductor manufacturing system and method processes workpieces by introducing electromagnetic waves into a vacuum chamber via a quartz member and by generating plasma by exciting gas within the vacuum chamber and comprises heater for heating the quartz member.

In the semiconductor manufacturing system constructed as described above, and the semiconductor manufacturing process described above the temperature of the quartz member is raised by heating it with the heater. Because the reaction product adhering to the quartz member is more likely to evaporate due to the increased quartz member temperature, less of, the reaction product adheres to the quartz member and the deposit on it is reduced. Less of the deposited reaction product peels off resulting in a suppression of falling reaction product that has been adhering to the quartz member.

The specific nature of the invention, as well as other objects, uses and advantages thereof, are described in following description and in the accompanying drawings in which like numerals refer to like parts.

DESCRIPTION OF THE PREFERRED EMBODIMENTS

Preferred embodiments of the invention will be explained below in detail with reference to the drawings. Although the invention will be explained here by exemplifying a dry etching process in micro-processing systems for producing devices typified by semiconductors and electronic device parts, the invention is not limited to such a case and the same applies to other processes such as CVD and sputtering.

Figure 1:
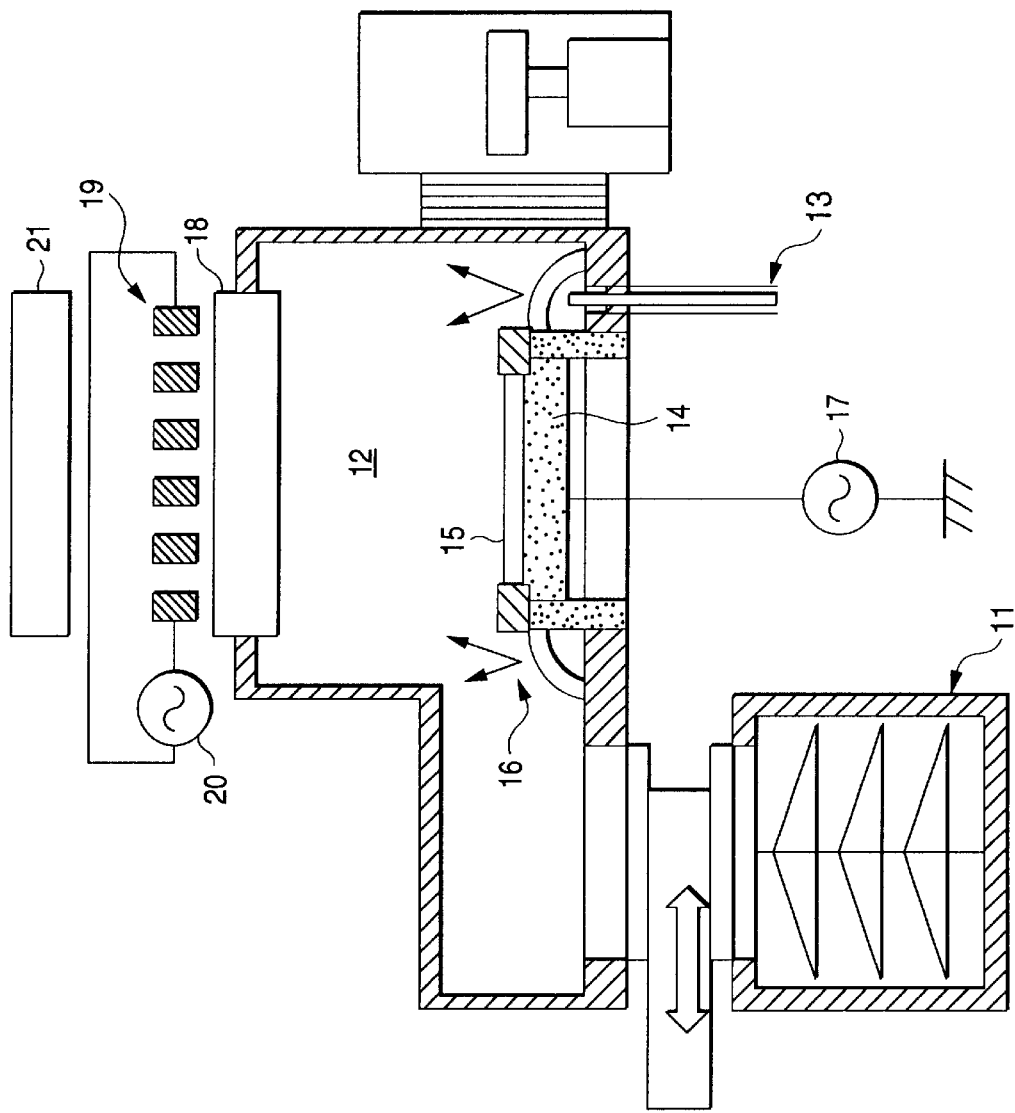
FIG. 1 is a structural drawing showing the outline of a high-density plasma etching system and a manufacturing method thereof according to a first embodiment of the invention.

FIG. 1 is a structural drawing showing the outline of a high-density plasma etching system in which an upper surface of a chamber is made of quartz glass and an RF (high-frequency) coil is disposed immediately above this upper surface. In the system shown in FIG. 1, a chamber 12 is vacuumed by an exhauster 11 such as a turbo molecular pump, and a as such as CF4 is supplied to the vacuum chamber 12 from a gas supplying section 13.

Then, a wafer 15 which is introduced to the chamber is absorbed by an electrostatic chuck 16 in order to accurately transmit the temperature of a lower electrode 14 whose temperature is controlled precisely by a tiller or the like to the wafer 15. High frequency power is provided to the lower electrode 14 from a high-frequency power supply 17 to generate a bias magnetic field on the lower electrode 14 to control a quantity of ions to be input.

A coiled TCP (transformer coupled plasma) electrode 19 is disposed immediately above the vacuum chamber 12 via a quartz top board (quartz glass) 18 in order to generate high-density plasma within the vacuum chamber 12. This high-density plasma etching system generates the high-density plasma by generating electro-magnetic waves (by giving the high-frequency power to the TCP electrode 19 from a high-frequency power supply 20) and by introducing these electro-magnetic waves to the vacuum chamber 12 via the quartz top board 18 in order to excite the gas.

Then, in order to suppress reaction product from adhering to the quartz top board 18 in the high-density plasma etching system constructed as described above, the system heats the quartz top board 18.

As a method for heating the quartz top board 18, it is conceivable to adopt a method of heating by a heater using a Nichrome wire or of utilizing radiant heat in general. However, the Nichrome wire method poses a problem in that it makes it difficult to effectively introduce the generated electro-magnetic waves well to the vacuum chamber 12, and makes it impossible to generate high-density plasma because the metal is interposed between the quartz top board 18 and the TCP electrode 19. However, using radiant heat also poses a problem in that it is unable to raise the temperature of the quartz top board 18 because the quartz glass is transparent and it transmits radiant heat instead of absorbing it.

In order to heat the quartz top board 18, the high-density plasma etching system uses far infrared rays which do not transmit through the quartz glass according to the first embodiment of the invention. A far infrared ray heater 21 is disposed above the quartz top board 18 in FIG. 1. In this embodiment, electromagnetic radiation transmission through the quartz glass occurs at an ordinary radiant heat wavelength of 200 nm or more, thus the quartz top board transmits ordinary radiant heat.

However, because the emission of the far infrared rays by the far infrared ray heater reaches 100% at a 5 nm wavelength (a frequency that the quartz glass is not transparent at) by heating the quartz top board 18 by the radiant heat of the far infrared rays emitted from the far infrared ray heater 21, the radiant heat is not absorbed by the quartz glass and the quartz top board 18 may be heated without affecting the electro-magnetic waves generated by the TCP electrode 19 and introduced via the quartz top board 18.

Because the temperature of the quartz top board 18 rises and the adhered reaction product is more likely to evaporate by heating the quartz top board 18 as described above, less of the reaction product adheres to the quartz top board 18, reducing the deposition of the reaction product. The reaction product adhering is quartz top board 18 to be suppressed from falling, reducing the particles which are otherwise produced by the fall of the reaction product and semiconductors may be manufactured with a good yield.

Figure 2:
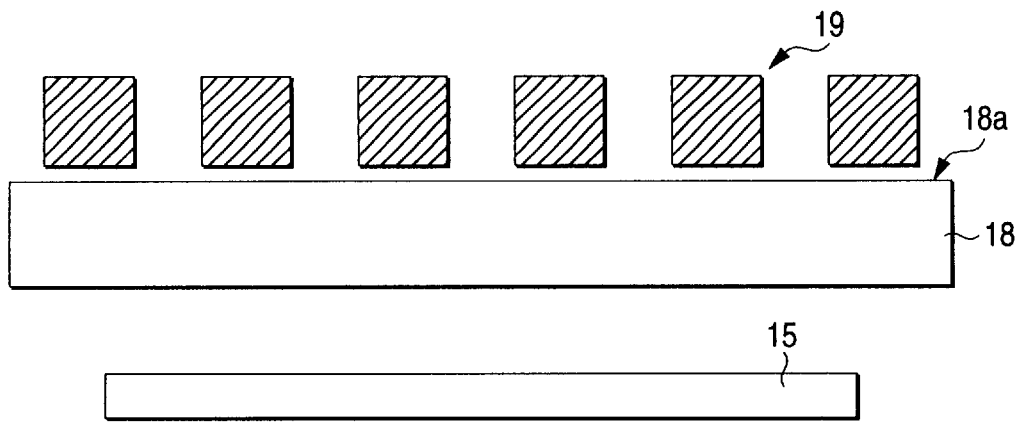
FIG. 2 is a structural drawing showing a modified example of the first embodiment.

It is also possible to prevent the transmission of the radiant heat of the far infrared rays emitted from the far infrared ray heater 21, i.e., the heat absorption rate may be improved, by implementing a sand-blast treatment on the surface of the quartz top board 18, or more preferably on the surface on the atmosphere side, i.e., on the surface 18a on the TCP electrode 19 side, as shown in FIG. 2, so that the quartz top board 18 may be heated efficiently and produce the beneficial results noted above.

Figure 3:
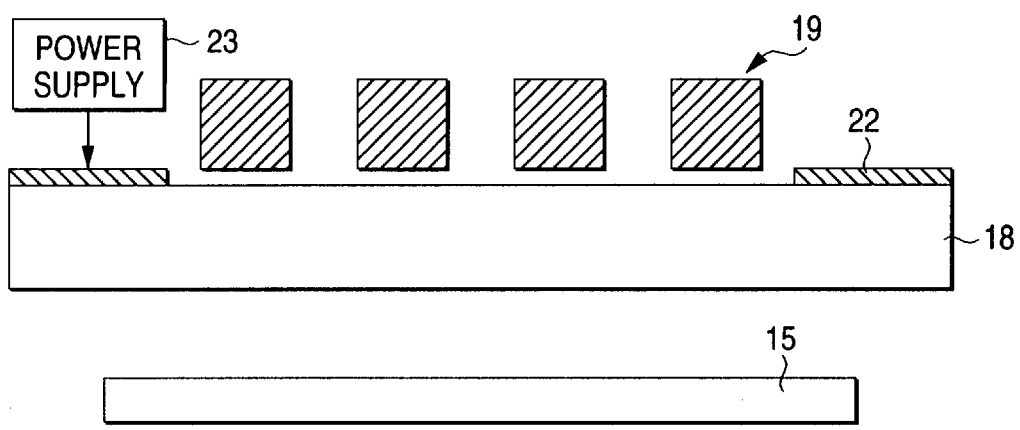
FIG. 3 is a structural drawing showing the main part of a high-density plasma etching system and a manufacturing method thereof according to a second embodiment of the invention.

FIG. 3 is a structural drawing showing the main part of a high-density plasma etching system and a manufacturing method thereof according to a second embodiment of the invention.

In the second embodiment of FIG. 3, the system is configured to deposit a transparent conductive film, e.g., an ITO (indium tim oxide) film 22, on the surface of the quartz top board 18, or more preferably on the surface on the TCP electrode 19 side and in a region where no electro-magnetic wave is transmitted, i.e., on the region outside of the TCP electrode 19, and to feed power to it by a power supply 23 as mechanism for heating the quartz top board 18. Here, the power supply 23 may be AC or DC; it may be any power supply as long as it can heat the ITO film 22.

The ITO film 22 generates heat by Joule heat when power is fed to it. This heat is transmitted directly to the quartz top board 18 from the surface of the region where no electro-magnetic wave is transmitted by employee the heater. This ITO film is arranged by depositing the ITO film 22 on the surface of the quartz top board 18 in the region where no electro-magnetic wave is transmitted and to feed power thereto this second embodiment permits, the quartz top board 18 to be heated efficiently without affecting the electro-magnetic waves introduced via the quartz top board 18.

The temperature of the quartz top board 18 rises and the reaction product adhering to it is more likely to evaporate in the same manner as in the first embodiment, so that less of the reaction product adheres to the quartz top board 18. Accordingly, because it reduces the deposit of the reaction product and allows the reaction product adhering to the quartz top board 18 to be suppressed from falling, the particles which are otherwise produced by the fall of the reaction product may be reduced and semiconductors may be manufactured with a good yield.

Figure 4:
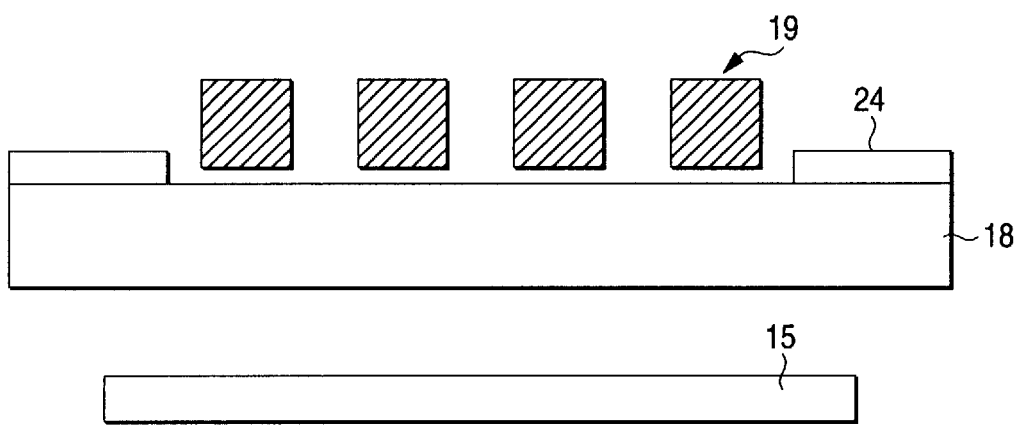
FIG. 4 is a structural drawing showing the main part of a high-density plasma etching system and a manufacturing method thereof according to a third embodiment of the invention.

It is noted that, as shown in FIG. 4, it is possible to use a contact heater or preferably a thin heater 24 on the surface of the quartz top board 18 or preferably on the surface on the TCP electrode 19 side in the region where no electro-magnetic wave is transmitted, i.e., in the region outside of the TCP electrode 19, to use as a heater even though the efficiency for heating the quartz top board 18 using the contact/thin heater to the heater used in the second embodiment, i.e, the heater arranged so as to deposit with the ITO film being deposited on the quartz top board, and the heater feeding power to it.

Although the heating efficiency drops as compared to the case of the second embodiment when the thin heater 24 is used as the heater (because it is a contact type) it can heat the quartz top board 18 without affecting the electro-magnetic waves introduced via the quartz top board 18 because it is disposed in the region where no electro-magnetic wave is transmitted. Accordingly, it allows the reaction product to be suppressed from adhering to the quartz top board 18, the particles which are otherwise produced due to the fall of the reaction product to be reduced, and semiconductors to be manufactured with a good yield.

It is noted that the present invention is not limited to the embodiments described above and the modifications of them. The processing conditions such as the plasma source, the system configuration, the sample arrangement and etching gas may be selected adequately within the scope of the present invention.

The invention is also applicable to the ICP (inductive coupled plasma) and ECR (electron cyclotron resonance) type etching systems. It is also applicable not only to the etching system but also to many semiconductor manufacturing systems configured to introduce electro-magnetic waves into a vacuum chamber via a quartz member and to generate plasma by exciting gas within the chamber. It is also applicable to a method using such systems.

As described above, according to the invention, less of the reaction product adheres to the quartz member by raising the temperature of the quartz member. The reaction product adhering to the quartz member may be suppressed from falling as a result by adopting the configuration of heating the quartz member in the semiconductor manufacturing system for processing workpieces by introducing electro-magnetic waves into the vacuum chamber via the quartz member, and by generating plasma by exciting the gas within the chamber, reducing the particles which are otherwise caused by the fall of the reaction product adhering to the quartz member. The method using this system achieves the same results.

While the preferred embodiments have been described, variations thereto will occur to those skilled in eh art within the scope of the present inventive concepts which are delineated by the following claims.

What is claimed is:

1. A semiconductor manufacturing method, comprising the steps of:

introducing a wafer into a vacuum chamber;

introducing gas into said vacuum chamber;

introducing electro-magnetic waves to said vacuum chamber via a quartz member to generate plasma by exciting the gas within said vacuum chamber; and heating said quartz member to remove reaction product adhering to said quartz member while said electro-magnetic waves are introduced into said vacuum chamber.

2. The semiconductor manufacturing method according to claim 1, wherein said quartz member is heated with a far infrared ray heater.

3. The semiconductor manufacturing method according to claim 2, further comprising the step of sand-blasting a surface of said quartz member.

4. The semiconductor manufacturing method according to claim 1, further comprising the steps of:

disposing a transparent conductive film of said heater only in a region of said quartz member where no electro-magnetic wave is transmitted; and feeding power to said transparent conductive film.

5. The semiconductor manufacturing method according to claim 1, further comprising the step of disposing a heater only in a region of said quartz member through which no electro-magnetic wave is transmitted.

* * * * *